United States Patent [19]

Campagna et al.

[11] Patent Number: 5,341,157
[45] Date of Patent: Aug. 23, 1994

[54] LASER-DRIVEN SILK SCREEN MASK DEVICE

[75] Inventors: Gerald L. Campagna, San Jose; David Chapman, Sebastopol, both of Calif.

[73] Assignee: Bumb & Associates, San Jose, Calif.

[21] Appl. No.: 930,057

[22] Filed: Aug. 14, 1992

[51] Int. Cl.$^5$ .................................. B41J 24/435
[52] U.S. Cl. ................................... 346/108; 346/139 R
[58] Field of Search ................. 346/108, 139 R, 76 L, 346/160

[56] References Cited

U.S. PATENT DOCUMENTS

| | | | |
|---|---|---|---|
| 3,696,742 | 10/1972 | Parts et al. | 346/76 L |
| 4,566,016 | 1/1986 | Masuda | 346/108 |
| 4,698,649 | 10/1987 | Lee | 346/108 |
| 4,714,933 | 12/1987 | Suzuki | 346/108 |
| 4,720,618 | 1/1988 | Stamer et al. | 346/108 |
| 4,805,973 | 2/1989 | Watanabe | 346/108 |
| 4,975,714 | 12/1990 | Rose | 346/108 |

OTHER PUBLICATIONS

ARGON advertisement (1992) for L.E.S.
MOGRAFO advertisement (1992) for Laser Beam Engraver.
MOGRAFO announcement in *Screen Process* of Apr. 1992, p. 62.

*Primary Examiner*—Mark J. Reinhart
*Attorney, Agent, or Firm*—Phillips, Moore, Lempio & Finley

[57] ABSTRACT

A computer driven device for making silk screens suitable for making signs, PC boards, mask, metal, textile graphics and the like is disclosed. The device uses a laser beam to burn holes in a thin sheet of plastic, preferably nylon. The laser beam is directed toward the surface of the nylon screen and the beam is moved incrementally under computer control to position the two before activation of the laser. The desired sign or pattern to be burned into the screen is constructed by means of a microprocessor or PC using a desk top type publishing program. The finished nylon "silk" screen can be used in the same manner as conventional silk screens.

9 Claims, 8 Drawing Sheets

LASER-DRIVEN SILK SCREEN MASK DEVICE

BACKGROUND OF THE INVENTION

The production of signage, graphics on textiles or printed circuit boards, generally is accomplished in one of several ways. The first and least economical for multiple signs is hand painting. This of course requires a skilled sign painter and for each sign the sign painter must start over even though the signs are identical. Hand painted signs are effective in that a skilled sign painter can add a great deal of artistic skill to the finished product. They are particularly appropriate for single applications and for very large signs.

At the other end of the scale are signs produced by offset printing or lithography. Lithography has been used since at least as early as the nineteenth century. It involves a negative image made of an oily based material on a master plate (originally a stone hence the prefix "litho"). The plate with the master image is wetted with water and then inked with a material that adheres only to the oily material. The plate is passed through a press with paper so that the image is transferred to the paper as a positive. This old lithograph process is essentially the basis for today's "offset" printing where a positive image is transferred to the master and then to the final paper hence the term offset. Careful preparation and elaborate offset presses permit overprinting of various colors (three or four for example) so that many thousand copies can be made from one master. Lithography or offset printing has, because of its flexibility and economies, withstood the rigors of time and has recently replaced set type or hot type printing to the extent linotype machines and the like have disappeared from use all in a matter of a few years.

In between the sign painter and lithography or offset printing is silk screening, a process that combines the features of both. It provides flexibility to the sign-painter/artist while allowing multiple copies. Silk screen, depending on the process used, can reproduce hundreds of copies without degradation of the master.

The process, in its historical sense, can be likened to making a stencil. The artist or sign painter first prepares the screen and then blocks out the areas that are not to be printed. In effect a "stencil" is prepared. However the "stencil" consists of a piece of woven and porous fabric, traditionally silk, where the fabric is made impervious to ink in all places except where the printing is wanted. Once the "silk screen" is prepared, it may be put in a printing frame so that paper or other material may be placed under the screen and ink applied to the opposite side of the screen then "squeegeed" onto the paper thereby making an image on the paper, wood, metal or textiles. By using multiple screens it is possible to work in colors so that multiple color images may be made. The traditional silk screen process which is still practiced in artist communities, involved a good deal of hand work in making the image in a negative fashion on the silk screen with a substance that is impervious to the ink that will be used. In recent years, photo transfer processes have been developed so that the "stencil" like image can be readily transferred to the screen using a photo process.

Silk screening, when used commercially is a relatively easy and inexpensive procedure that takes minimum amount of equipment yet will make multiple copes, up in the hundreds. However, the screens are not easily stored for future use and are often cumbersome.

The principal drawback in silk screening is the time element involved in preparing the screen. Even with the advent of the photo process, silk screen work requires a good deal of "artistic" ability with little or no capability to edit or the like. For these reasons silk screening has been generally limited to the artistic fields or to rather mundane signs with little imagination, In the past ten years there has been almost an explosion in desk top publishing. Desk top publishing provides a capability not available several years ago except to the most sophisticated printing establishment, Words such as fonts, point size, kerning and the like all associated with printing, have now joined the everyday vocabulary. Not only has desk top publishing given the personal computer user the composition capability of large scale printing firms; it also provides the corollary capability of graphic composition that permits a mix of print and graphics, something only the most sophisticated printing firms had until recently. The graphics may consist of "canned" items such as borders or preconceived designs, but also may permit the user to literally "draw" his or her own design while intermingling text with the design.

Once the text and design are completed, current technology such as laser printing permits the material to be printed and thus previewed. Should the design be in more than one color, then separate designs can be obtained and previewed for each color. State of the art software publishing programs permit these graphic images and textual material to be "translated to bit maps" so that at a density of, for example 300 dots or bits per inch, the image is sent to a printer capable of registering the image to that resolution.

This invention combines the classical art of silk screening with desk top publishing.

It is the principal object of this invention to provide an apparatus driven by a computer that will make and print a silk screen pattern.

It is another object of this invention to provide an apparatus that will make a silk screen of synthetic non porous sheet material is less expensive or more economical than silk.

It is also an object of this invention to provide an apparatus where the "screen" is non porous except where the image is desired.

It is still another object of this invention to provide an apparatus wherein a pattern of holes can be transferred to a non porous screen by means of a laser.

SUMMARY OF THE INVENTION

The laser-driven silk screen mask device disclosed herein includes a laser and a series of reflectors to change the direction of the laser. An XY table is included so that the reflected laser can impinge on a surface upon which the XY system is mounted. Stepping motors controlled by a computer incrementally move the XY table to desired positions so that the laser can be activated to burn holes in a nylon sheet placed on the surface supporting the XY system.

The invention also includes a method of preparing a stencil for use in the silk screen printing process that includes the steps of providing a thin sheet of thermal plastic and a frame for mounting the plastic. It also includes the step of providing a laser beam that will impinge on the plastic and means to reposition the frame and laser beam relative one to the other. Finally the laser beam is operated intermittently to burn holes in the sheet of plastic.

DETAILED DESCRIPTION OF THE PREFERRED EMBODIMENTS

Figure 1:
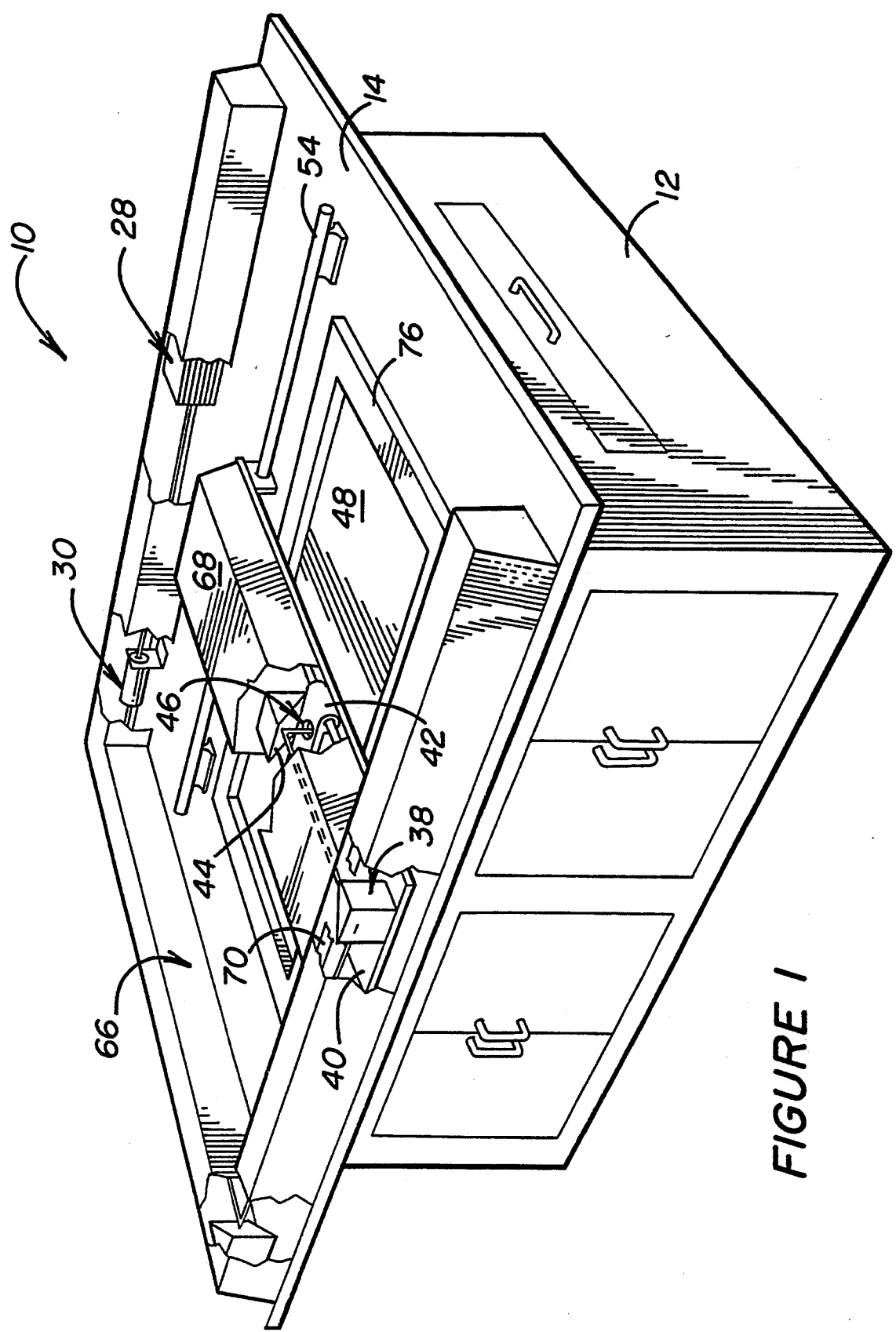
FIG. 1 is a perspective view of the laser-driven silk screen mask device.

Referring now to FIG. 1, a laser-driven silk screen mask device 10 is shown in perspective. The mask device 10 includes a base cabinet 12 and a work surface 14.

Figure 4:
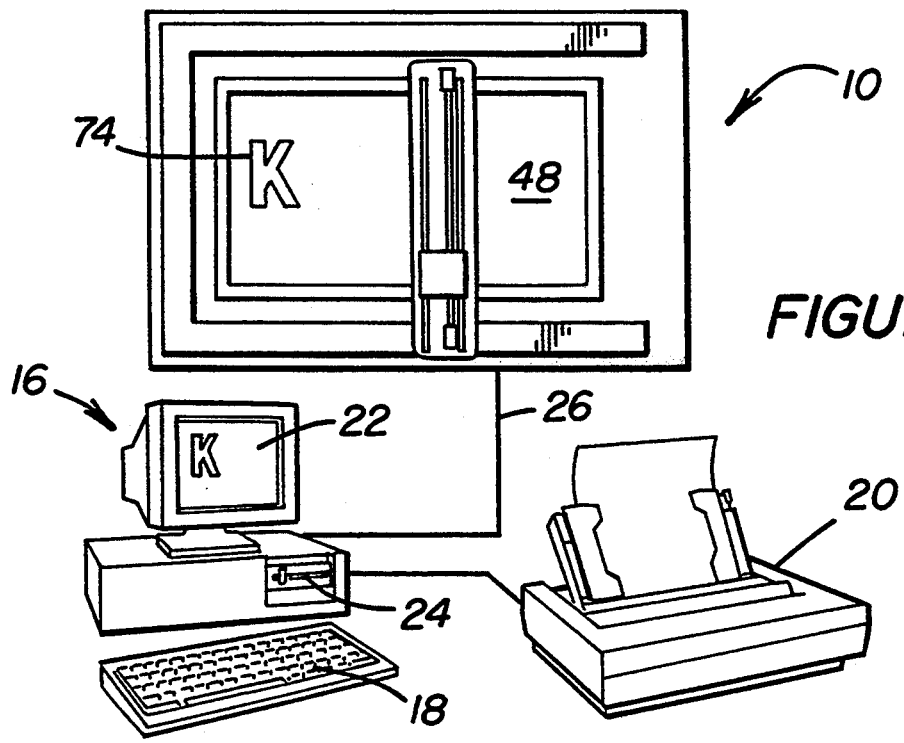
FIG. 4 is a plan view partially schematic of the laser-driven silk screen mask device showing the associated computer and printer in perspective.

Referring to FIG. 4, a microprocessor 16 having a keyboard input member 18 and a printer 20 is associated with the laser-driven silk screen mask device. Microprocessor 16 has the usual cathode ray tube or video display tube 22 and external storage such as a floppy disk drive 24. It is envisioned that a microprocessor using the Intel series of chips 80486, 80386 or the like would be appropriate; however other microprocessors using other chips and operating systems would be equally appropriate. In the preferred embodiment described herein, the basic software includes a disk operating system of the type found in the IBM compatible machines and more important a "desk top publisher," preferably the Postscript ® system available from Adobe Systems Incorporated of Mountain View, Calif. The computer system 16 with its associated key board and printer may be located contiguous to the laser-driven silk screen mask device or at some remote location but connected therewith by appropriate cabling 26.

Figure 2:
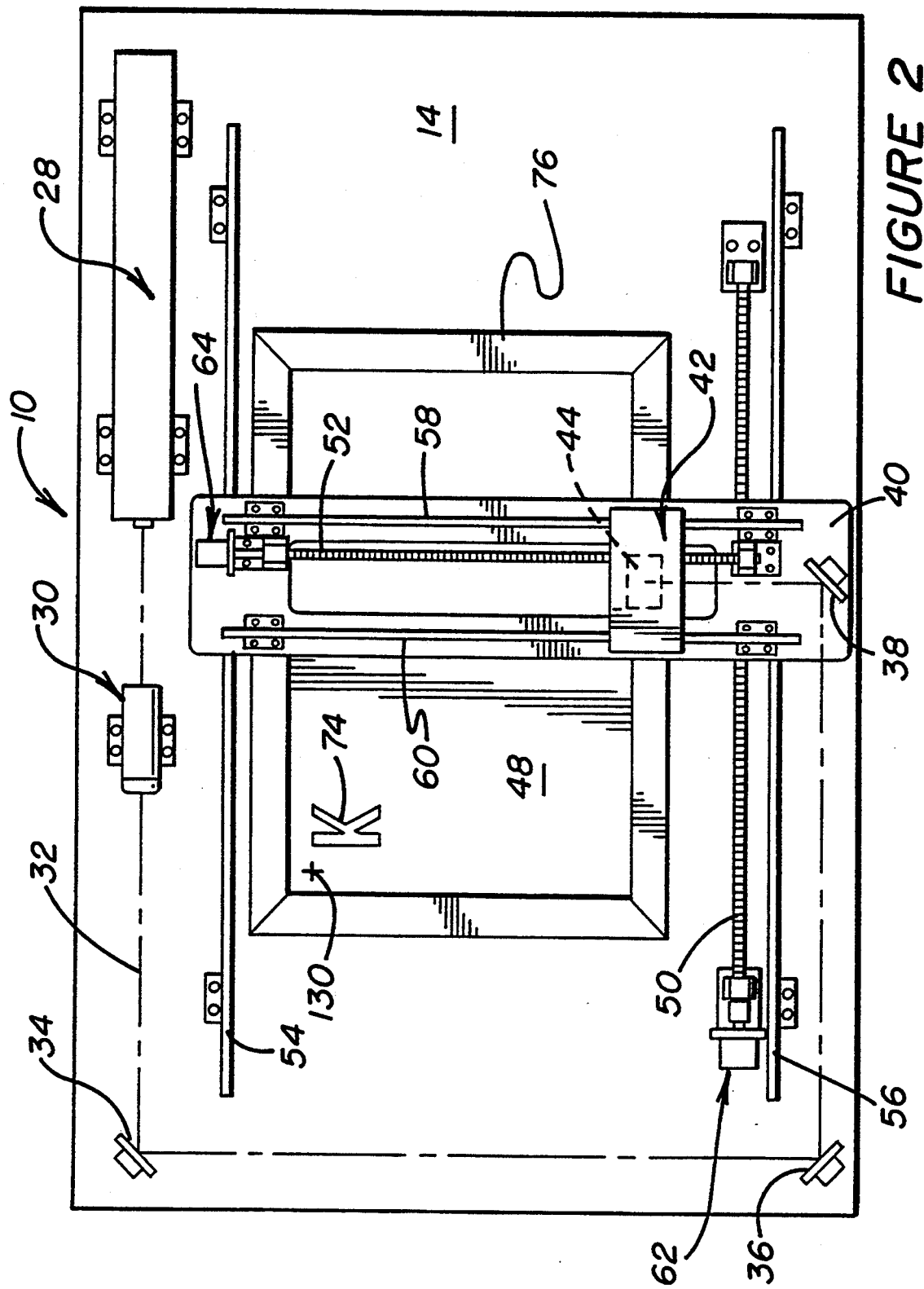
FIG. 2 is a plan view of the laser-driven silk screen mask device.

Referring now to FIG. 2, the plan view of the laser-driven silk screen mask device 10 includes a carbon dioxide laser 28 located on the work surface 14 adjacent one corner thereof. In the preferred embodiment, a Synrad $CO_2$ Model 48-2-28 laser is used. The output of laser 28 is passed through a beam expander 30 which collimates the output of the laser. The laser beam 32, once it has passed through beam expander 30, is reflected by a series of mirrors 34, 36 and 38. Mirrors 34 and 36 are positioned at 45° to the beam 32 so that the beam is turned at right angles by both mirrors 34 and 36 thereby reversing directions so that the laser beam which, as shown in FIG. 2 is directed from right to left in the top of the figure, and in the bottom of FIG. 2 the laser beam is directed from left to right. Mirror 38 is positioned on a moveable platform 40. Moveable platform 40 is more commonly called an XY table because when coupled with a second table 42 a tool, in this case a prism or mirror 44, may be moved orthogonally that is, in an X and Y direction with reference to the familiar cartesian coordinate system. Thus the beam 32 is reflected by mirror 38 mounted on XY table 40 to mirror 44 which in turn is mounted on the cross table 42. When the beam 32 intercepts the mirror or prism 44 as shown in FIG. 1, it is reflected downwardly through a focusing lens 46.

The beam 32 having now been focused, can impinge upon a workpiece or screen 48 which in turn is mounted on surface 14.

Referring again to FIG. 2, XY table 40 and the cross table 42 are driven respectively by jack screws 50 and 52. The XY table 40 is mounted upon a pair of tracks 54 and 56 which are parallel to each other and provide easy movement for table 40 in the X direction.

In like manner, the cross table 42 is slidably mounted upon tracks 58 and 60 so that cross table 44 can operate smoothly across the table 40 in the Y direction.

Jack screw 50 which controls the X direction is operated by stepping motor 62. In like manner, jack screw 52 is operated by a stepping motor 64. Both of these stepping motors are interconnected with the microprocessor 16. More will be said about the control of the stepping motors in the subsequent discussion. These stepping motors are designed to operate so that they provide four hundred steps per revolution while the jack screws have a ten pitch. This permits thirty-two steps in the stepping motor to provide a movement of 8/1000ths of an inch. As a result, the laser which is reflected downwardly by tubular mirror 44 and then focused by focusing lens 46 can step in the X direction or the Y direction at a rate of 125 stops per inch, the effective resolution of this invention. It is to be understood that more precise resolution is within the scope of the invention.

Also included with the laser-driven silk screen mask device are covers 66 and 68. Cover 66 is fixed to surface 14 and protects the user from possible injury either from the XY table 40 or from the laser beam 32 itself. It should be noted that cover 66 is formed so that the side facing work surface 14 is open as at 70 so that the XY table 40 is free to move with its mirror 38 capable of reflecting the laser beam 32 onto the cross table 42.

Figure 5:
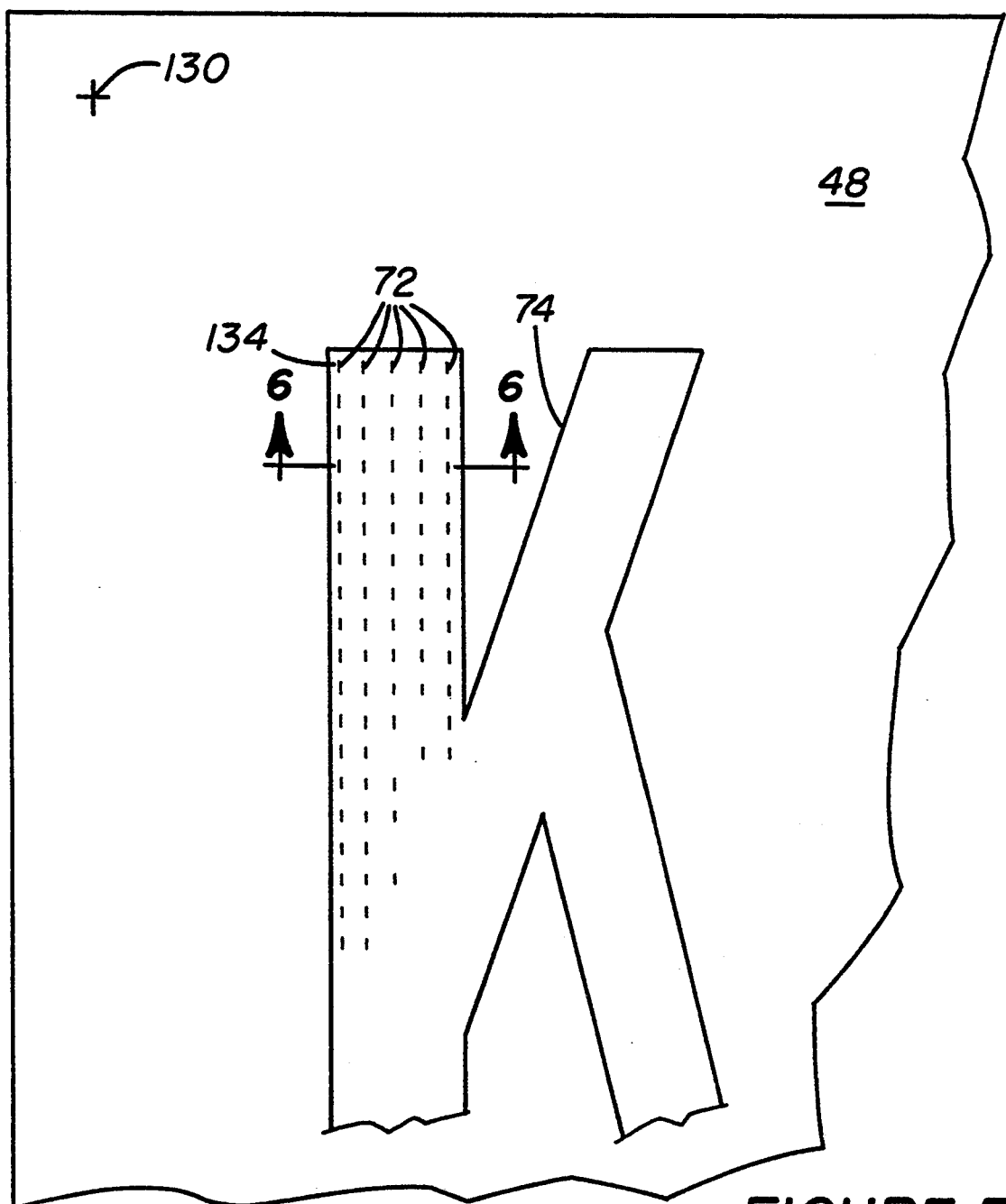
FIG. 5 is a portion of a silk screen prepared by the laser-driven silk screen mask device.
Figure 6:
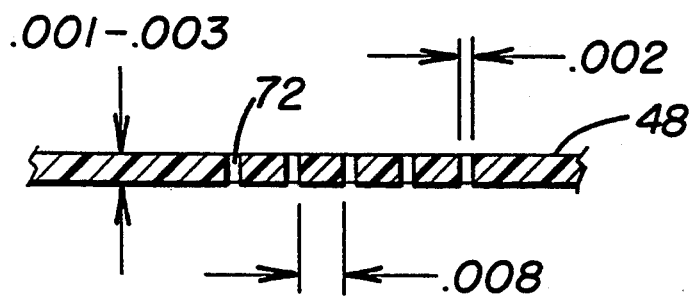
FIG. 6 is a cross-sectional view of the silk screen shown in FIG. 5 taken a section lines VI, VI.

Referring again to FIG. 2, the "silk screen" 48 is in fact a 1 to 3 mil nylon sheet that is, in its initial state, impervious to inks and the like. As stated in the background, the ordinary silk screen used in conventional silk screen work is in fact a porous material wherein that part of the image that is desired to be blocked out is made impervious by some wax-like material or in the case of a photo process by the deposition of a photo resist-type material on the screen. In the present instance, one starts with a solid screen and by positioning the laser at a desired position is able to burn a hole through the nylon membrane or "silk screen" 48. Such efforts are shown by the letter K in FIGS. 2 and 4. This letter K is shown in a larger scale in FIG. 5. While exaggerated, a series of holes 72 represented by dots are shown in FIG. 5 within the confines of the letter K. It is to be understood that the straight lines 74 shown in FIG. 5 are representation only of the shape. The final nylon membrane or silk screen 48 with its burned in K will not have the straight lines however the dots or holes 72 will, if inspected, form essentially the letter K. As previously noted, these dots are at a rate of 125 holes per inch or basically 8/1000ths of an inch apart. This can be seen in FIG. 6, a cross section of some of the dot shown in FIG. 5 wherein the dimension of 8/1000ths of an inch is illustrated. The ten watt Synrad carbon dioxide laser that is utilized in this system is intermittently activated on each stop of the XY table to burn a hole through the nylon membrane of about 2/1000ths of an inch. The reader is cautioned that the scale shown in FIG. 6 is exaggerated for clarity. Finally, the silk screen 48 shown in FIG. 2 is mounted in a frame 76 which may be used in the familiar silk screen process. That is the ink, once the silk screen has been prepared (in this case a nylon membrane), is squeegeed through the holes 72 onto a paper, wood, metal or textile mounted beneath the silk screen in the conventional manner.

THE COMPUTER CONTROL

Referring again to FIG. 4, a microprocessor 16 is associated with the device 10 described herein. Microprocessor 16 has a conventional operating system and a graphic or desk top printing program. As previously stated, the preferred embodiment utilizes the Postscript system manufactured by Adobe which is mounted or operated in an IBM compatible system utilizing the disk operating system in a microprocessor using an Intel 80286, 80386 or 80486 chip or one of the compatible chips manufactured by other chip makers. It is assumed that operation of microprocessors is a familiar process to the readers of this invention. Accordingly, the flow chart description that follows assumes that the computer is operable and that the graphics program about to be described can be called up in the normal manner.

This program is designed not only to construct a possible sign or the like, but further through an interface will control the XY table to the degree mentioned above and further will "fire" the laser 28 when the laser beam is positioned in the desired position.

Figure 7:
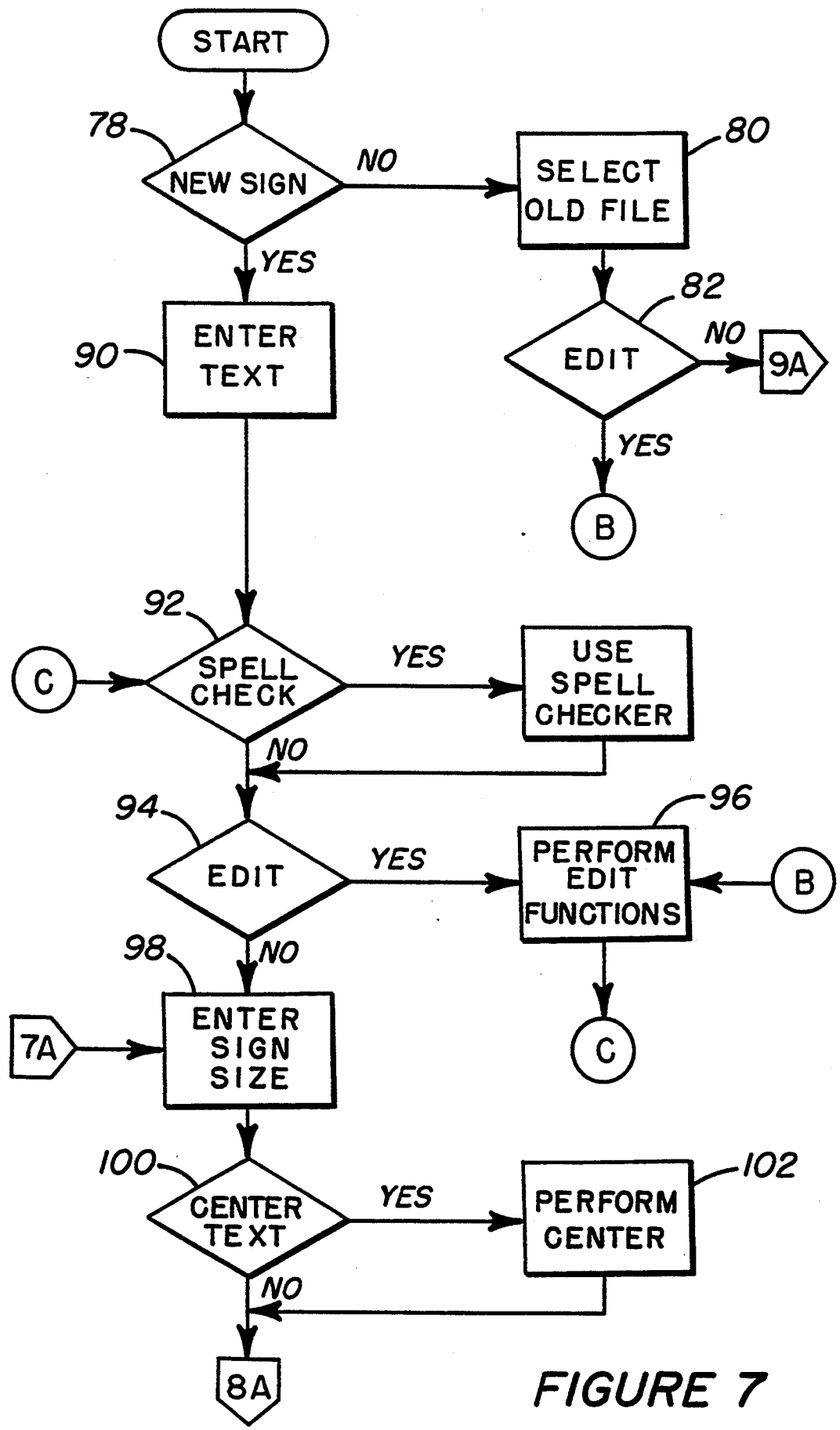
FIGS. 7, 8, 9 and 10 are respectively flow charts of the computer program used to operate the disclosed laser-driven silk screen mask device.

The flow chart which begins in FIG. 7, first asks if the user is desirous of making a new sign. This is shown in decision block 78. The reason of this query is that it is quite probable that the user would want to edit an existing "sign" for which a data base is established, in which case the user is given the option of using a "sign" already in existence which may be stored on a floppy diskette. At this point the user would select the old file and enter the edit portion of the program through step B.

Figure 9:
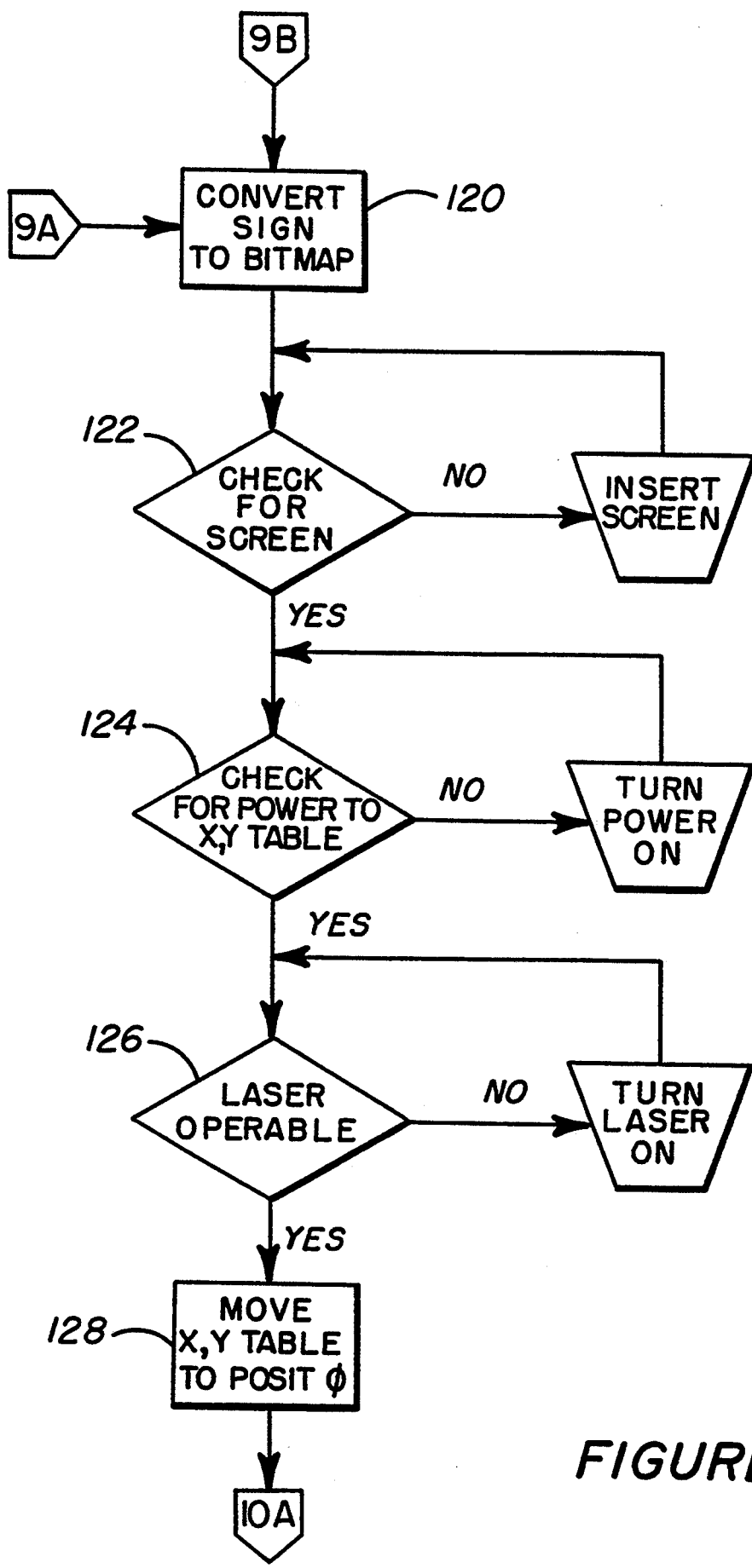

On the other hand, it may well be that the old nylon membrane has worn out and must be re-cut. Accordingly, the user is given the option of selecting the old file and then passing right to the operation of the program which produces the silk screen, starting in the flow chart in FIG. 9.

On the other hand, if the user wishes to start a new sign he may enter text as indicated in operation block 90. Utilizing the conventional systems available in word processors and desk top publishing programs, a spell check capability is given at decision block 92 so that the user can avoid embarrassing situations of having a misspelled word in the finished sign. Subsequent to the spell checker, the user is given an edit capability at decision block 94 so that any errors or corrections may be performed as shown in operation block 96. It is noted that decision block 82 set forth above following the selection of the old file reenters the flow chart at this point as shown by the connector B in FIG. 7. In like manner, once the edit functions are completed the program is directed back to the spell check decision block 92 by connector C. Assuming that the user has passed the spell check and does not want to perform any more edit functions, the sign size can be entered in operation block 98. The entry of the sign size is important, as it will determine the limits of movement of the XY table 40 and 42 as shown in FIG. 2. In short, one would not wish to operate the laser in any position other than over the nylon membrane. Thus, the sign size, which is entered here after the text has been entered determines the perimeter of the desired nylon membrane in which the sign will be embodied. Decision block 100 to "center the text" is a conventional feature in graphics or desk top publishing programs and need not be further discussed here. The text can be centered right and left or up and down or in both directions. Furthermore, margins may be selected in the performed centering block 102. Here again these margins, if entered, will determine the maximum movement of the XY table in the particular sign that is to be prepared.

Figure 8:
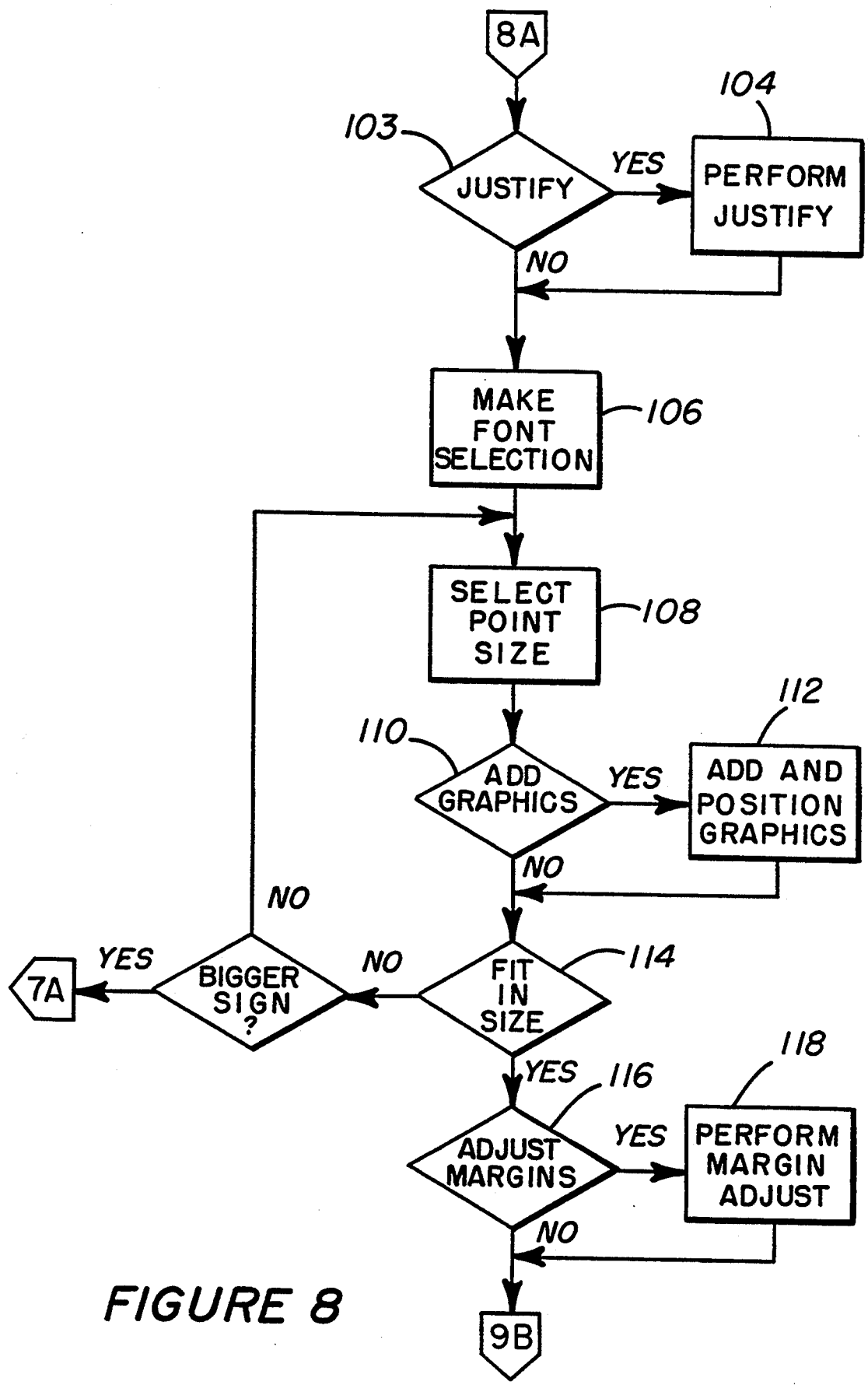

Referring now to FIG. 8, the next step in preparing the sign is to ask if the sign should be justified as shown in decision blocks 103. Justification, as is well-known in the art, is a process of whether the text should be moved to the left margin or the right margin or the top or the bottom or centered. Should the user select to justify as opposed to center, this function is performed in operation block 104. Depending upon the capability of the desk top publishing program, which underlies this basic invention, one is given the option of making a font selection and selecting point size in operation blocks 106 and 108. For the reader's information, the font selection is the style type that is utilized while the point size is the size of the type that is to be utilized.

Again depending upon the capability of the underlying graphics program the user is given the option of adding graphics in a graphics decision block 110. These graphics may be either readily available graphics such as margins or directional indicators or the like or in the more sophisticated programs could in fact be artistic work performed by the user. Such is done in operation block 112.

Finally, the program asks if the desired text and graphics would fit in the size selected at operation block 98. This step is necessary as the point or type size selection may be such that the sign is too big for the sign size selected. The user may, depending upon the capability of the underlying machine, select a larger screen size rather than go back and select a smaller point size. Should the larger screen be selected, then one is directed back to FIG. 7 at connector box 2 wherein a new sign size is entered. Again, following the check, in decision block 114 on sign size, the margins may be adjusted at decision block 116. If such is to be done, then the margins can be adjusted in operation block 118.

It is to be understood that the user is observing the development of the sign on the visual display tube 22 during the process of the operation just described. At any time the user is free to readjust the sign based on the appearance on the visual display tube 22 (VDT 22). Furthermore, at this point, a "proof" can be printed on a printer capable of printing the graphic material on a screen. This printer envisioned as printer 20 in FIG. 4 may very well be of the laser type which would be capable of printing both text and graphics presented by the Postscript program.

Should the user be satisfied, the operation is then passed along to converting the displayed sign on VDT 22 to a bit map. This is the first operation block 120 in FIG. 9. Once the desired bit map has been prepared, then operation of the laser drive silk screen mask device is to be undertaken. The underlying program that converts the sign to a bit map capable of driving a laser-driven silk screen mask device converts the image just developed to 125 dots per inch which is compatible with the resolution of the XY table 40. Concurrently, it develops commands for the XY table 40 so that it may be positioned at any point above the screen 48 through a motor controller such as Controller No. SDM7 produced by New England Affiliated or Oriental Motor Co., Ltd. This program is available on a printed circuit board available from Rips, Inc. and is also available in software emulation from Lasergo Inc. as Go Script.

Before operation of the machine, the user is queried with several questions. First, as indicated in decision block 122 the user is queried for the presence of the screen or nylon membrane 48. If such a screen is not present, then the user is directed to insert such a screen. This step may be done through automation in using a reflected light or the like wherein the surface 14 is insufficient to reflect the light back into a sensor (not shown) whereas the screen 48 would be sufficient to reflect the light into a sensor. Thus, the presence or absence of a screen may be done manually by the user or in a more sophisticated environment by a sensing mechanism. Other means to sense the presence of a screen are envisioned as being within the ambit of this invention.

Next, the system checks to see if the XY table is powered as in decision block 124. If the XY table is not powered, then power is either turned on by the user or it is turned on automatically. Finally, a check is made to see if the laser is operable in decision block 126.

Figure 10:
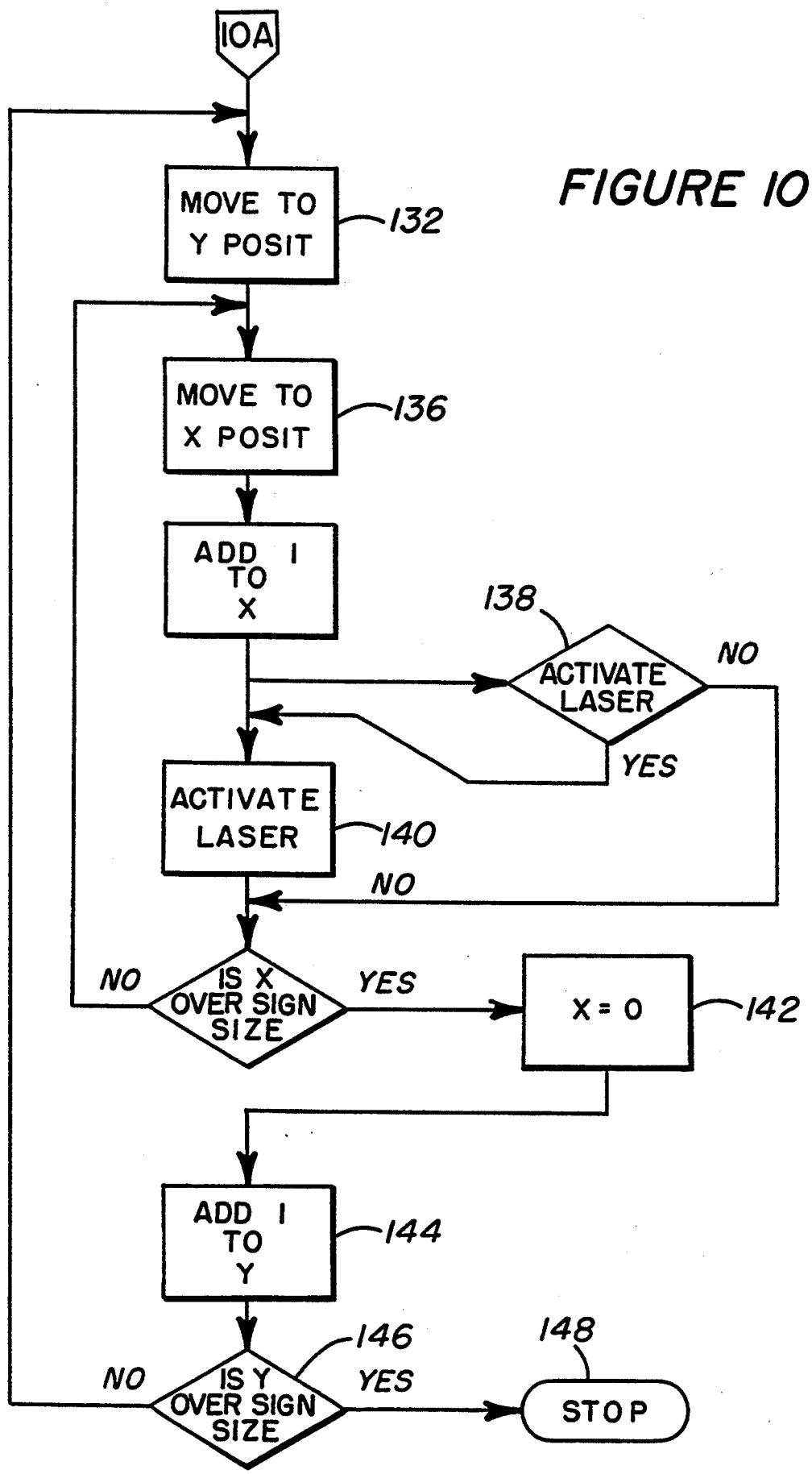

Having passed these three tests, the XY table is moved to position zero as indicated in operation block 128. Position zero in the instant invention is a relative position determined by the XY coordinates entered in the sign size as indicated in FIG. 7 of the flow chart. For illustration purposes, position zero can be the upper left hand corner of the desired sign as indicated at 130 in FIG. 2. If the position zero is as shown in FIG. 2, then the Y direction is downwardly, that is the Y direction increases as the cross table 42 moves downwardly as shown in FIG. 2, while the X direction increases as the XY table 40 moves to the right. Since position 130 is relative, the movements just described are solely to oriented the present program to the flow chart and illustration. Moving to FIG. 10, the cross table 42 is moved to the initial Y position from the zero position in operation block 132. This initial Y position may be at the upper left hand corner of the illustrative letter K and in fact, over the first hole 134 shown in FIG. 5. On the other hand, the program can be designed so that the zero position 130 can correspond to the uppermost Y position and the leftmost X position as determined by the bit map which was developed at operation block 120. The XY table 40 is then moved to the X position which again would be to the right as shown in FIG. 5 from initial position 130. This is shown in operation block 136. The counter is then activated for the X position by adding one, that is, an 8 mil movement of the table would occur the next time the table is moved. The program is then checked to see if the laser should be activated. Referring to FIG. 5, the position 134 clearly indicates that a hole should be burned in the screen. On the other hand, if there is no textual material or graphic material at that position, then the laser is not activated and the loop continues. This situation would exist after the five holes 72 illustrated in FIG. 5 have been completed. Whether addition holes are to burned in the nylon membrane to the right of the sign shown in FIG. 5 is a matter that can be determined only by the program. It may be appropriate to include material in the program to see if there is an addition X coordinate that must be "burned" before the right hand edge of the sign is reached. Considerable time and storage space can be saved in the bit map if the bit map which was constructed at operation block 120 is done so that it passes from left to right and from to p to bottom but is directed to the next operable position for the laser rather than stopping at each intervening 1/125ths of an inch.

Should the laser be activated then, as previously mentioned it is done so at operation block 140.

At this point the counter is checked to see if the X dimension is over the sign size which again was entered in the program at operation block 98 in FIG. 7. If X is not over the signal size, then the program loops back to move to the next operation position as shown in operation block 136. If X is over the sign size then X is zeroed at operation block 142 and the Y dimension is incremented at operation block 144. As is evident, it may well be that adding one to the Y counter will place the Y over the sign size as shown in decision block 146. Should this occur, then the program is brought to a stop at end point 148 and an indication is given to the user to that effect. If the Y is not over the sign size then it is returned to operation block 132 then the sequence just described is repeated until the sign is completed.

ALTERNATE EMBODIMENT

Figure 3:
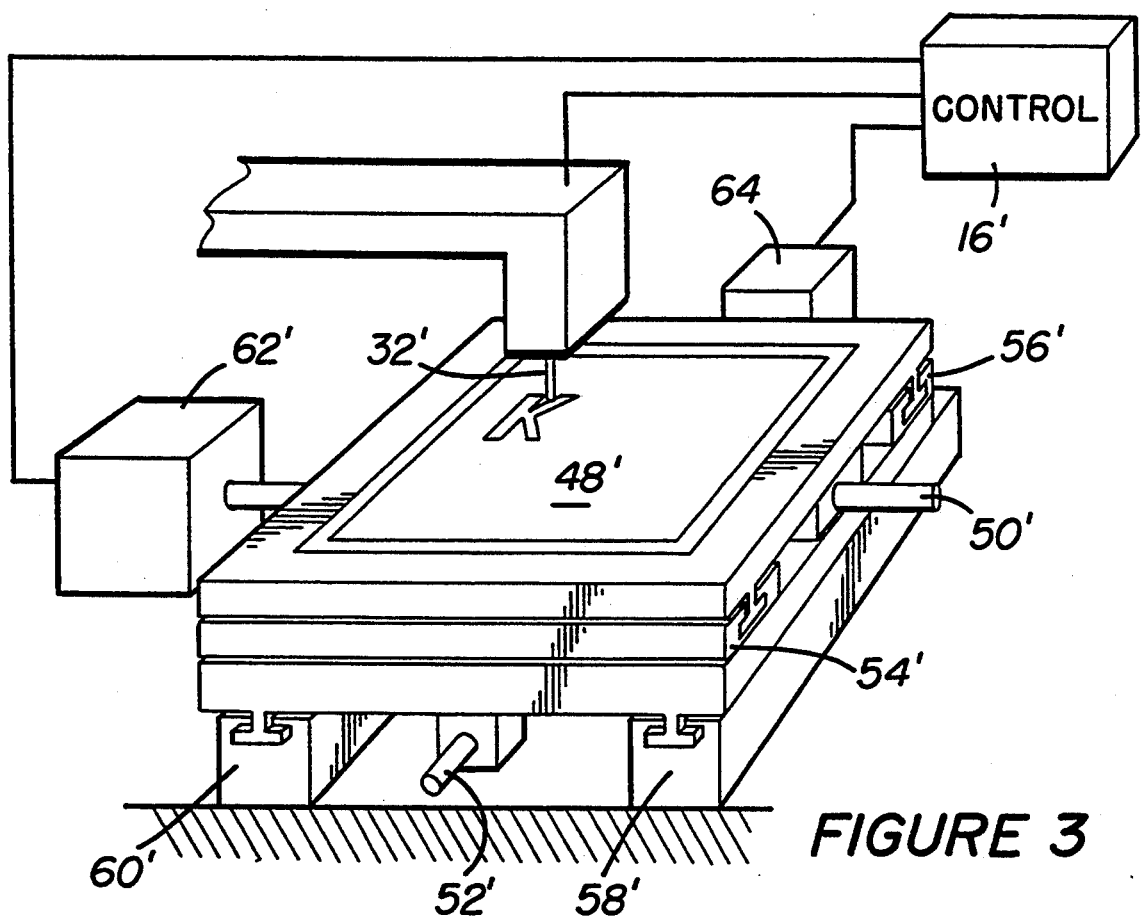
FIG. 3 is an alternative embodiment of the laser-driven silk screen mask device.

Referring to FIG. 3, an alternate embodiment of the present invention is illustrated. It is presumed that the program just described and the method for developing the program is the same in this embodiment. The basic difference between this embodiment and the previously described embodiment is that the screen 48' is moved on an XY table by corresponding jack screws 50' and 52'. This is accomplished by corresponding tracks 56' and 54' along with the tracks 60' and 58' as illustrated in FIG. 3. The motor controllers 62' for the X direction and 64' for the Y direction are essentially the same as that described above. The laser beam 32' is fixed relative to the surface 14' of the base cabinet. Again, it is emphasized that the only difference between the alternate embodiment described herein and the preferred embodiment described in detail, is that the alternate embodiment moves the screen under the laser while in the principal embodiment the laser beam is moved by the XY table through a series of mirrors to be over top of the screen. Control of the alternate embodiment is accomplished through a microprocessor 16' programmed in the same manner as the microprocessor 16 in the principal embodiment.

OPERATION OF THE PREFERRED EMBODIMENT

While operation of the preferred embodiment is most probably obvious to a user at this point, a brief description of such operation will be included. The system starts with the preparation of the sign by means of a computer program resident in the microprocessor 16. The sign or whatever is desired to be put onto a screen is done through the use of conventional desk top publishing programs such as Postscript as described above. Certain parameters are important however as the sign size or screen size must be determined to provide parameters to the XY table so that the laser can be operated within the outer boundaries of the desired sign. Once the desired sign has been prepared so that it presents a usable appearance on the video display tube 22, it is converted to a bit map with the resolution of 125 bits per inch. While this resolution is the preferred resolution in this invention, other resolutions within the capability of the art may be utilized. The operation of the system is then passed to the motor controller and after checking for the presence or absence of the nylon screen, power to the XY table and power to the laser, the motor controller part of the program moves the XY table in increments of 8 mils or a resolution of 125 dots per inch to the various locations for the laser to be activated, thereby burning a hole in the screen. Once the program is completed, the screen with its accompanying frame 76 may be removed from the surface 14 and utilized in a conventional silk screen press.

We claim:

1. A laser-driven silk screen mask device comprising:
   a laser;
   a series of more than two reflectors for changing the direction of said laser;
   a table system whereby the last two of said series of reflectors may be moved orthogonally one to the other so that said laser is reflected in a beam normal to said table system;
   said table system including a surface upon which a thin sheet of non-woven thermal plastic material is placed, said surface being normal to said reflected laser beam;
   means for incrementally moving said table system along a first and a second directions; and
   means to activate said laser intermittently with sufficient power to burn holes in said sheet of non-woven thermal plastic material.

2. The device of claim 1, wherein said table system is operated along said first and second directions by a pair of orthogonally mounted jack screws.

3. The device of claim 2 wherein the jack screws are operated by stepping motors.

4. The device of claim 3 wherein said table system includes an X table which is mounted on a pair of parallel rails along said first direction, and a Y table which is mounted on a pair of rails along said second direction, so that said Y table moves relative to said X table.

5. The device of claim 4 wherein the laser is a $CO_2$ laser.

6. The device of claim 5 wherein the laser includes a beam expander positioned between the laser and a first reflecting mirror.

7. The device of claim 6 wherein the laser is reflected a total of 270° in 90° increments in the same plane.

8. The device of claim 7 wherein the last 90° of reflection is caused by a mirror mounted on the X table.

9. The device of claim 8 wherein the last reflector is mounted on the Y table thereby reflecting the laser beam perpendicular to the XY table system.

* * * * *